United States Patent
Deniz et al.

(10) Patent No.: US 9,583,397 B1
(45) Date of Patent: Feb. 28, 2017

(54) SOURCE/DRAIN TERMINAL CONTACT AND METHOD OF FORMING SAME

(71) Applicant: GLOBALFOUNDRIES INC., Grand Cayman (KY)

(72) Inventors: Derya Deniz, Watervliet, NY (US); Benjamin G. Moser, Malta, NY (US); Sunit S. Mahajan, Halfmoon, NY (US); Domingo A. Ferrer Luppi, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/151,720

(22) Filed: May 11, 2016

(51) Int. Cl.
| | |
|---|---|
| *H01L 21/336* | (2006.01) |
| *H01L 21/8238* | (2006.01) |
| *H01L 29/45* | (2006.01) |
| *H01L 21/3205* | (2006.01) |
| *H01L 21/3215* | (2006.01) |
| *H01L 21/768* | (2006.01) |
| *H01L 21/321* | (2006.01) |
| *H01L 21/285* | (2006.01) |
| *H01L 21/266* | (2006.01) |

(52) U.S. Cl.
CPC .... *H01L 21/823814* (2013.01); *H01L 21/266* (2013.01); *H01L 21/2855* (2013.01); *H01L 21/28568* (2013.01); *H01L 21/3212* (2013.01); *H01L 21/3215* (2013.01); *H01L 21/32053* (2013.01); *H01L 21/76841* (2013.01); *H01L 21/76889* (2013.01); *H01L 29/45* (2013.01)

(58) Field of Classification Search
CPC ......... H01L 2924/00; H01L 2924/0002; H01L 2924/13091; H01L 21/26586; H01L 29/1095; H01L 29/6659; H01L 29/402; H01L 29/41766; H01L 21/823878; H01L 27/1203; H01L 29/4236; H01L 27/088; H01L 29/1083
See application file for complete search history.

(56) References Cited

U.S. PATENT DOCUMENTS

| | | | |
|---|---|---|---|
| 6,365,446 B1 * | 4/2002 | Chong | H01L 21/2652 257/E21.165 |
| 2013/0113050 A1 * | 5/2013 | Adkisson | H01L 21/28026 257/402 |

OTHER PUBLICATIONS

Harper et al., "Mechanisms for enhanced formation of the C54 phase of titanium silicide ultra-large-scale integration contacts," Annu. Rev. Mater Sci. 30:523-43 (2000).

* cited by examiner

*Primary Examiner* — Jaehwan Oh
(74) *Attorney, Agent, or Firm* — Francois Pagette; Hoffman Warnick, LLC

(57) ABSTRACT

One aspect of the disclosure relates to a contact within a dielectric layer to a source/drain terminal of a field-effect-transistor (FET). The contact may include: a titanium-tantalum-silicide at a surface of the source/drain terminal; a barrier layer over the titanium-tantalum-silicide; and a metal over the barrier layer and extending to a top surface of the dielectric layer.

16 Claims, 14 Drawing Sheets

SOURCE/DRAIN TERMINAL CONTACT AND METHOD OF FORMING SAME

BACKGROUND

Technical Field

The present disclosure relates to integrated circuits, and more particularly, to source/drain terminal contacts which have been implanted with a species, and methods of forming the same.

Related Art

Advanced manufacturing of integrated circuits requires formation of individual circuit elements, e.g., field-effect-transistors (FETs) and the like based on specific circuit designs. A FET generally includes source, drain, and gate terminals. The gate terminal is placed between the source and drain terminals. Transistors may be formed over a substrate and may be electrically isolated with an insulating dielectric layer, e.g., inter-level dielectric layer. Contacts may be formed to each of the source, drain, and gate terminals through the dielectric layer in order to provide electrical connection between the transistors and other circuit elements that may be formed subsequent to the transistor in other metal levels.

Conventionally, contacts to the source and drain terminals are formed by forming an opening within the overlying insulating dielectric layer(s) to expose the source and drain terminals. Subsequently, liner layers, e.g., titanium, and a metallization layer may be formed within the opening to fill the opening. Further, the process may include performing an anneal to create a silicide, i.e., silicon metal alloy, at the bottom surface of the opening and a top surface of the source and drain terminals thereby creating a surface for the contact connection. The silicide that is formed in aforementioned manner called liner silicide. The contact may be planarized evenly with a top surface of the dielectric layer.

The annealing process for this conventional silicidation process is limited to a temperature which does not cause damage to the gate terminal and the elements therein. However, silicide formation may require a high temperature in order to be performed. Therefore, there is a struggle to reach a temperature high enough to create the silicide for the source and drain contact without causing damage to the gate terminal. Furthermore, in some instances the silicide may not actually be formed leaving an intermetallic alloy on the active areas; i.e. source and drain terminals. The resultant silicide may have a better contact resistance performance on n-type FET (NFET) than p-type FET (PFET), which can be attributed to the difficulties of desired silicide formation on PFET as opposed to NFET.

SUMMARY

A first aspect of the disclosure relates to a method of forming an integrated circuit structure. The method may include: forming an opening within a dielectric layer to expose a source/drain terminal thereunder; forming a refractory metal layer and a titanium containing layer at a bottom surface of the opening; implanting a species within the refractory metal layer and the titanium containing layer; forming a barrier layer over the implanted refractory metal layer and the titanium containing layer such that the barrier layer substantially lines the opening; performing an anneal such that the refractory metal layer and the titanium containing layer combine to form a silicide at the bottom of the opening; and forming a metal over the silicide at the bottom of the opening and the barrier layer substantially lining the opening to substantially fill the opening.

A second aspect of the disclosure relates to a method of forming a set of contacts, the method may include: forming a first opening in a dielectric layer to expose a first source/drain terminal of a first field-effect-transistor (FET) and a second opening in the dielectric layer to expose a second source/drain terminal of a second FET; forming a refractory metal layer and a titanium containing layer at a bottom surface of each opening; forming a first mask over the refractory metal layer and the titanium containing layer at the bottom surface of the second opening; implanting a first species within the refractory metal layer and the titanium containing layer at the bottom surface of first opening; removing the first mask and forming a second mask over the refractory metal layer and the titanium containing layer at the bottom surface of the second opening; implanting a second species within the refractory metal layer and the titanium containing layer at the bottom surface of the second opening; removing the second mask; forming a barrier layer over the refractory metal layer and the titanium containing layer implanted with the first species within the first opening and over the refractory metal layer and the titanium containing layer implanted with the second species within the second opening such that the barrier layer substantially lines each opening; performing an anneal such that the refractory metal layer and the titanium containing layer implanted with the first species combine to form a first silicide at a bottom surface of the first opening and the refractory metal layer and the titanium containing layer implanted with the second species combine to form a second silicide at the bottom surface of the second opening; and forming a metal over the first and second silicides at the bottom of each opening and the barrier layer substantially lining each opening to substantially fill each opening.

A third aspect of the disclosure relates to a contact within a dielectric layer to a source/drain terminal of a field-effect-transistor (FET). The contact may include: a titanium-tantalum-silicide at a surface of the source/drain terminal; a barrier layer over the titanium-tantalum-silicide; and a metal over the barrier layer and extending to a top surface of the dielectric layer.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

Figure 14:
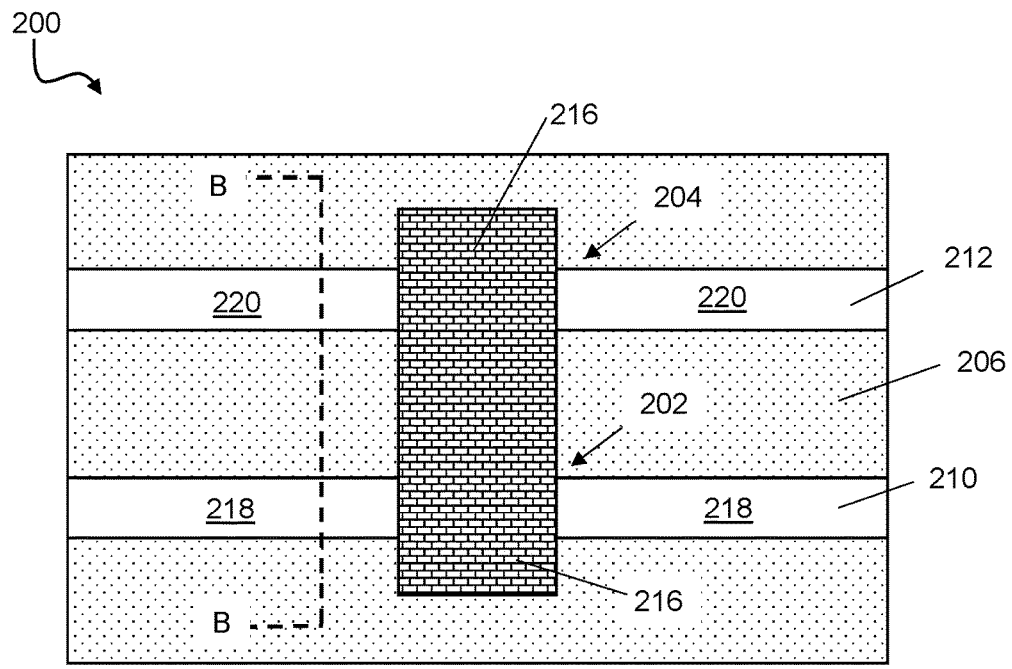
FIG. 14 shows a top-down view of a preliminary integrated circuit structure according to an embodiment of the disclosure.
Figure 28:
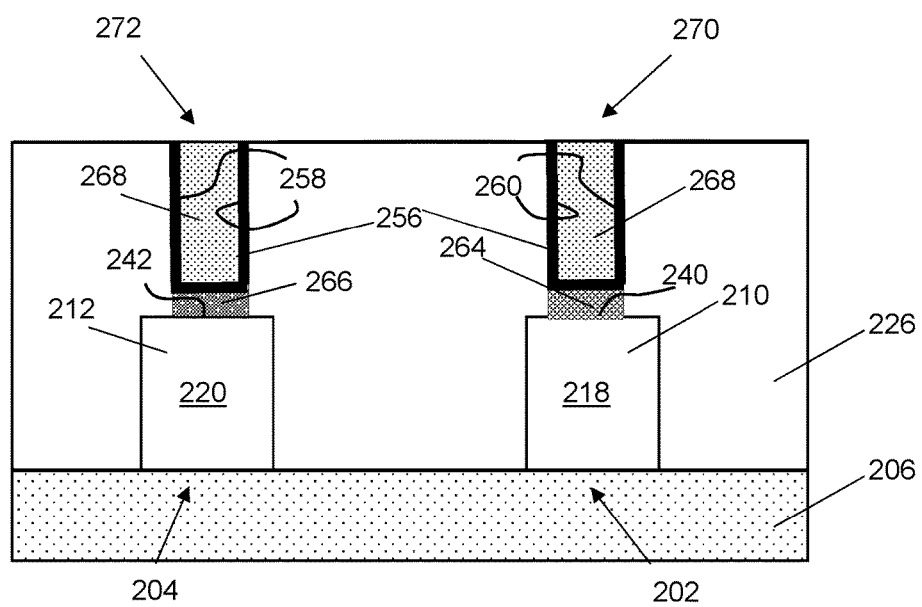

15-28 show cross-sectional views of the preliminary integrated circuit structure of FIG. 14 undergoing aspects of a method according to embodiments of the disclosure, with FIG. 28 showing a set of contacts to source/drain terminals of an n-type field-effect-transistor (NFET) and a p-type field-effect-transistor (PFET).

It is noted that the drawings of the disclosure are not to scale. The drawings are intended to depict only typical aspects of the disclosure, and therefore should not be considered as limiting the scope of the invention. In the entire set of drawings, like numbering represents like elements between the drawings.

DETAILED DESCRIPTION

The present disclosure relates to integrated circuits, and more particularly, to source/drain terminal contacts which have been implanted with a species, and a method of forming the same.

Figure 1:
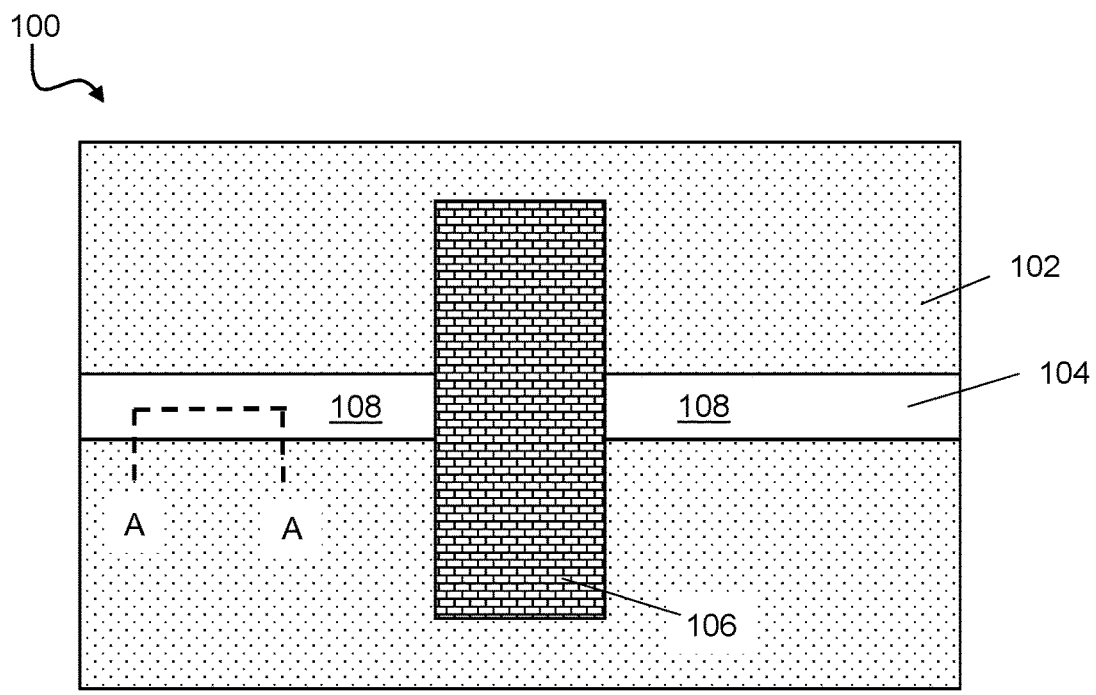
FIG. 1 shows a top-down view of a preliminary integrated circuit structure according to an embodiment of the disclosure.

FIG. 1 shows a top-down view of a preliminary integrated circuit structure 100. Integrated circuit structure 100 may be a fin-type field-effect-transistor (FINFET) as shown. That is, integrated circuit structure 100 may include a substrate 102 and a fin 104 overlying substrate 102. Further, integrated circuit structure 100 may include a gate structure 106 perpendicular to fin 104. However, it is to be understood that while aspects of the present disclosure are described with respect to FINFETs, the disclosure is equally applicable to other types of transistors, e.g., planar transistors.

In some embodiments, integrated circuit structure 100 may include a substrate 102 (shown) from which a plurality of fins, e.g., fin 104, were patterned. In one embodiment, substrate 102 may include a bulk substrate. Bulk substrates generally include a layer or wafer of semiconducting material without buried insulator layers contained therein, in contrast to semiconductor-on-insulator (SOI) substrates which include both semiconducting and insulating materials. Substrate 102 can be composed of any currently known or later developed semiconductor material, which may include without limitation, silicon, germanium, Furthermore, the entirety of bulk substrate 102 or a portion thereof may be strained. In other embodiments, substrate 102 may include an SOI substrate (not shown). In such an embodiment, fins, e.g., fin 104, may be patterned from a semiconducting layer overlying an insulating layer overlying another semiconducting layer.

Further, gate structure 106 may be formed perpendicular to and over fin 104 and over substrate 102. Gate structure 106 may include a gate dielectric, gate conductor, gate cap layer, and spacers as are known the art, but not shown herein for brevity. Fin 104 may be doped and or an epitaxial layer can be grown on it as known in the art to create source/drain terminals 108 on opposing side of gate structure 106.

Figure 2:
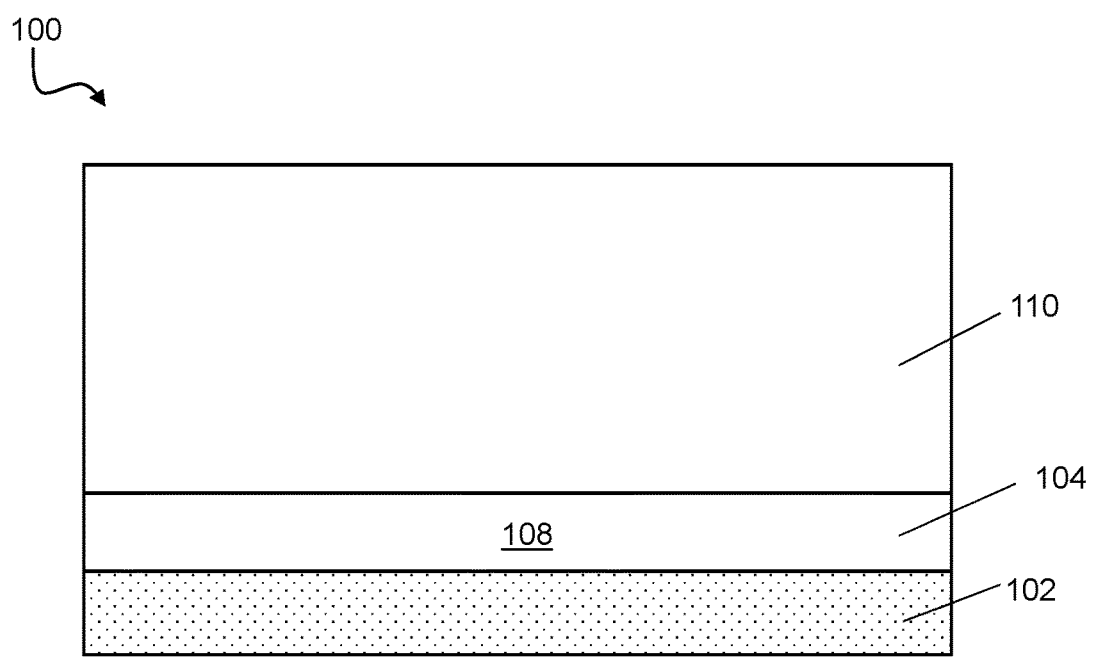
FIGS. 2-13 show cross-sectional views of the preliminary integrated circuit structure of FIG. 1 undergoing aspects of a method according to embodiments of the disclosure with FIG. 10 showing a contact to a source/drain terminal.

FIG. 2 shows a cross-section taken along line A-A of FIG. 1 but with a dielectric layer 110 formed over fin 104. Dielectric layer 110 may be formed via deposition such that dielectric layer 110 covers fin 104 and substrate 102. Dielectric layer 110 may be planarized (not shown) to atop surface of gate structure 106 (FIG. 1). Dielectric layer 110 can be composed of silicon oxide ($SiO_2$). Other dielectric materials can include, e.g., silicon nitride ($Si_3N_4$), hydrogenated silicon oxycarbide (SiCOH), carbon (C) doped oxides (i.e., organosilicates) that include atoms of silicon (Si), carbon (C), oxygen (O), and/or hydrogen (H). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Figure 3:
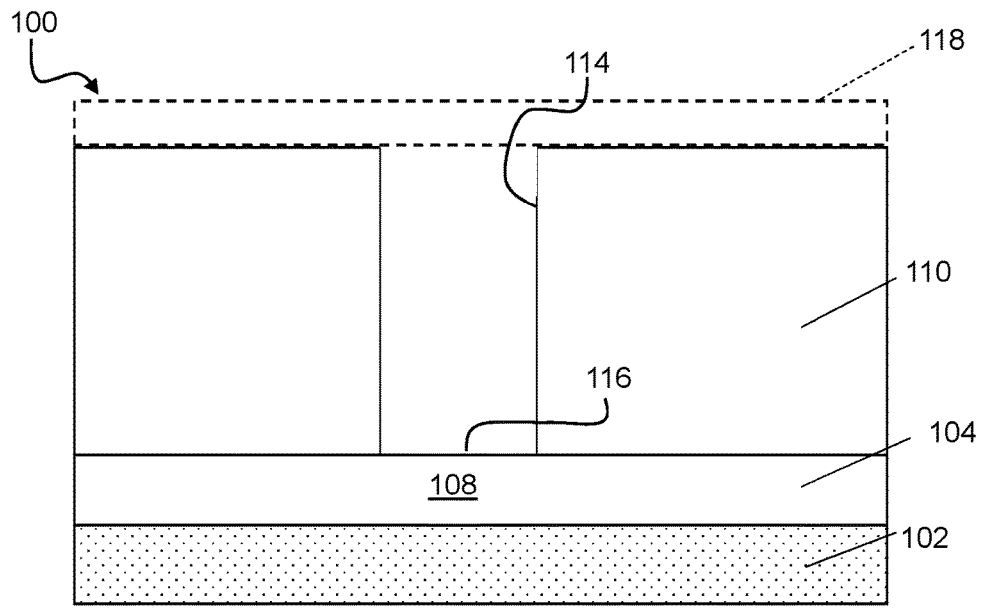

Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back. Referring now to FIG. 3, an opening 114 may be formed within dielectric layer 110 to expose source/drain terminal 108 of fin 104 at a bottom surface 116 of opening 114. That is, a mask 118 (shown in phantom) may be formed over dielectric layer 110 and patterned and etched to expose a top surface of dielectric layer 110 where opening 114 is to be formed. Subsequently, dielectric layer 110 may be etched to form opening 114 to expose source/drain terminal 108 of fin 104 and mask 118 may be removed. Opening 114 may facilitate formation of a contact to source/drain terminal 108 as will be described herein.

A "mask" is a material or stack of materials which may be formed over an underlying material which is to be processed. The mask may be patterned to have openings such that the underlying material is exposed. Subsequently, the underlying material may be processed where the underlying material is exposed by the openings in the mask. Once the underlying material is processed, the mask may be removed. Conventional masking materials include photoresist, silicon oxide, amorphous carbon, spin-on materials and silicon nitride.

"Etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches. Further, opening 114 may be cleaned prior to the formation of any material therein. Cleaning may include chemical or physical process cleaning, such as a plasma clean, and/or argon or hydrogen sputtering as known in the art.

Figure 4:
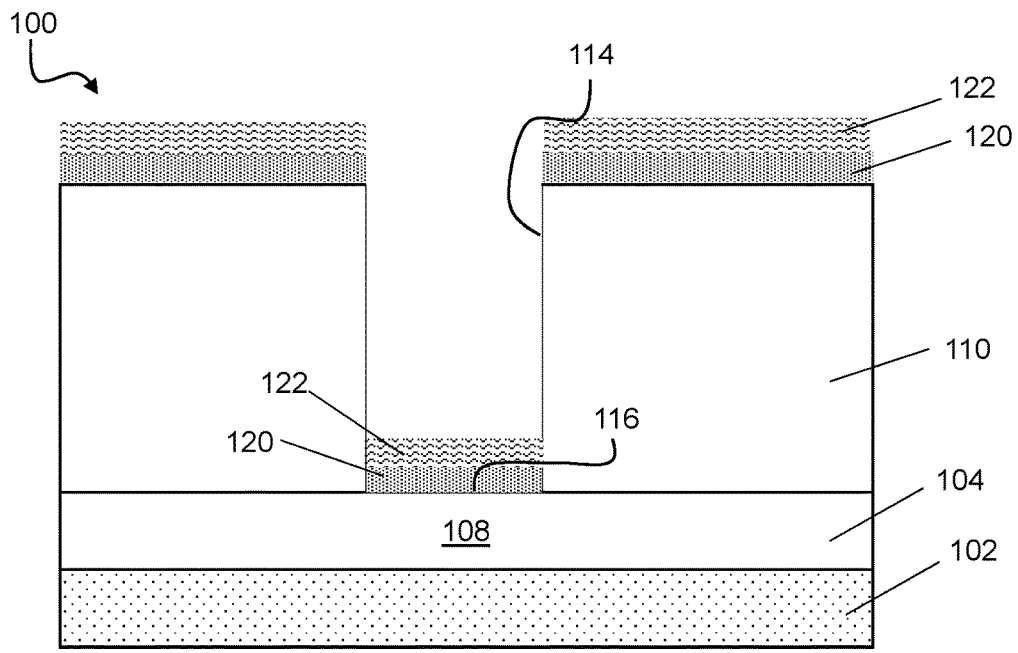
Figure 5:
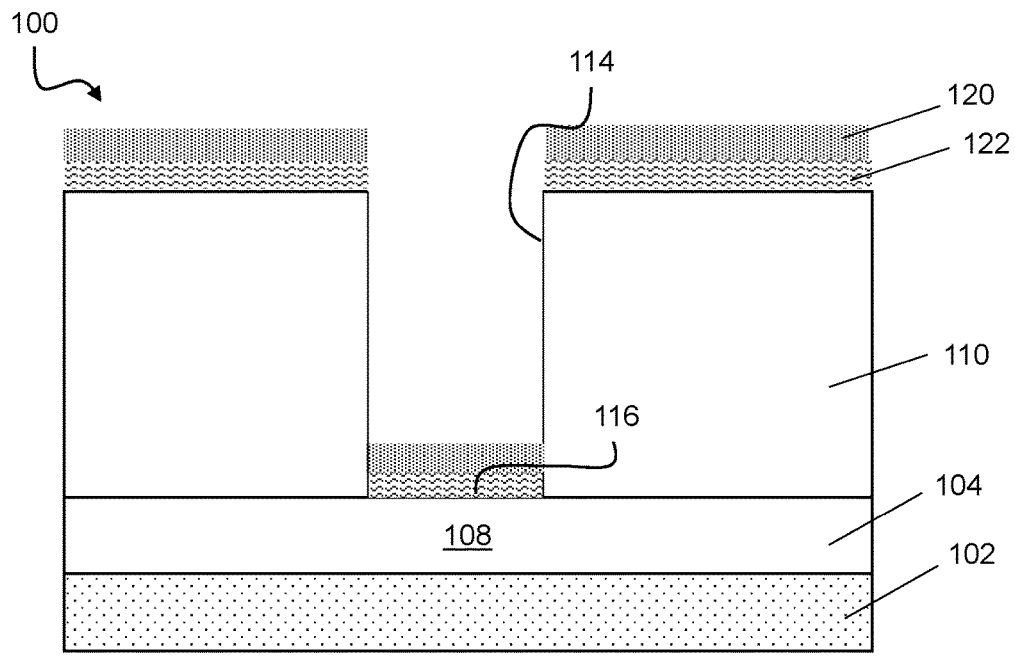

As shown in FIG. 4, a refractory metal layer 120 and a titanium containing layer 122 may be formed, e.g., via PVD, at bottom surface 116 of opening 114 and atop surface of dielectric layer 110. That is, refractory metal layer 120 and titanium containing layer 122 may be deposited such that refractory metal layer 120 and titanium containing layer 122 only line horizontal surfaces, e.g., a top surface of fin 104 exposed by opening 114 and a top surface of dielectric layer 110 outside of opening 114. Vertical surfaces, or the side walls, of opening 114 are not lined with refractory metal layer 120 and titanium containing layer 122. In some embodiments, refractory metal layer 120 may be formed prior to the formation of titanium containing layer 122 as shown in FIG. 4. In such an embodiment, refractory metal layer 120 may be formed such that refractory metal layer 120 is in contact with the bottom surface 116 of opening 114 or a top surface of the exposed fin 104, e.g., source/drain terminal 108, within opening 114. However, in other embodiments, titanium containing layer 122 may be formed prior to the formation of refractory metal layer 120 as shown in FIG. 5. In such an embodiment, titanium containing layer 122 may be formed such that titanium containing layer 122 is in contact with bottom surface 116 of opening 114 or atop surface of the exposed fin 104, e.g., source/drain terminal 108, within opening 114. In other embodiments, the forming of refractory metal layer 120 and titanium containing layer 122 includes at least one of: co-sputtering or co-deposition of refractory metal layer 120 and titanium containing layer 122. In another embodiment, an alloy of refractory metal layer 120 and titanium containing layer 122 may be formed on bottom surface 116 of opening 114. Refractory metal layer 120 may include, for example, at least one of: tantalum, molybdenum, ruthenium, tungsten, manganese, niobium, zirconium, or other refractory metals having similar properties. Titanium containing layer 122 may include, for example, titanium. Refractory metal layer 120 and titanium containing layer 122 may each be formed such that refractory metal layer 120 and titanium containing layer 122 each have a thickness of approximately 1 nm to approximately 25 nm. As used herein "approximately" is intended to include values, for example, within 10% of the stated values.

Figure 6:
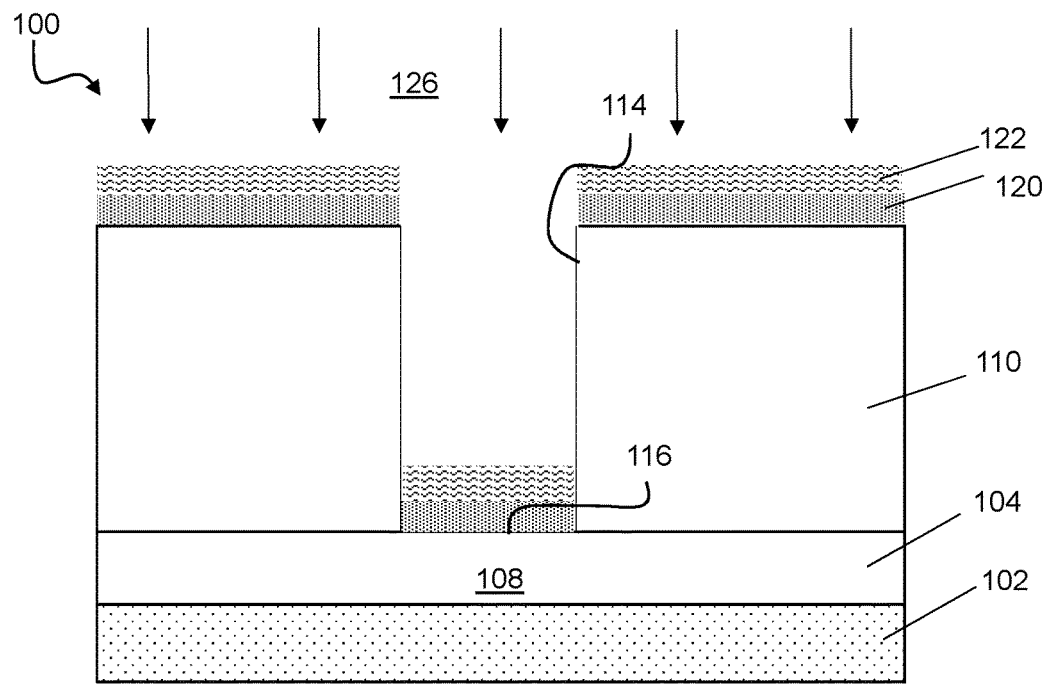
Figure 7:
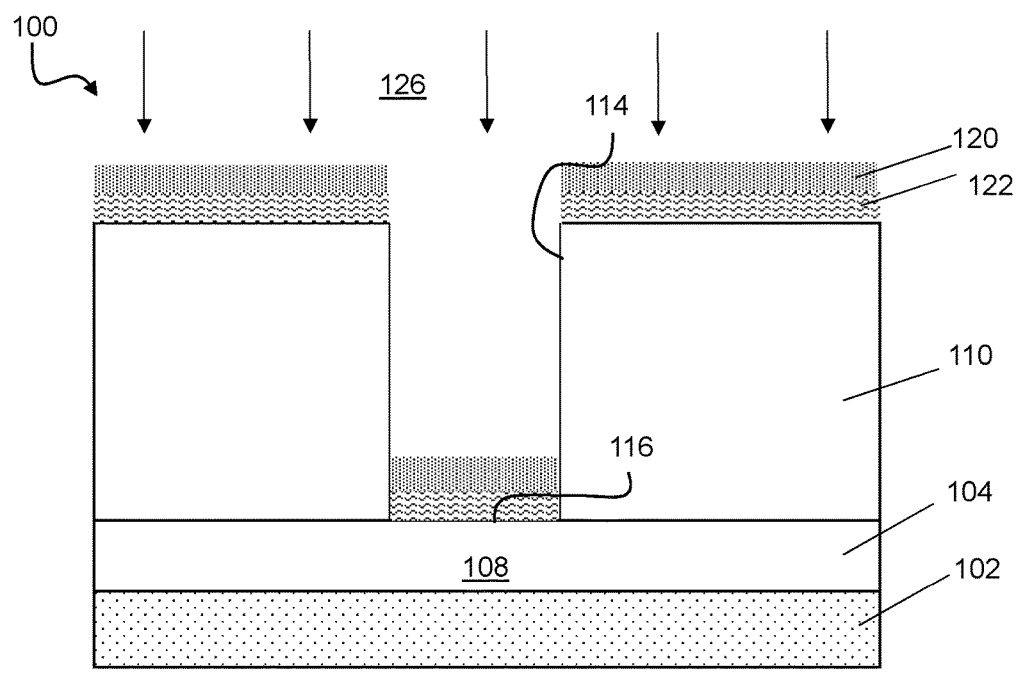
Figure 8:
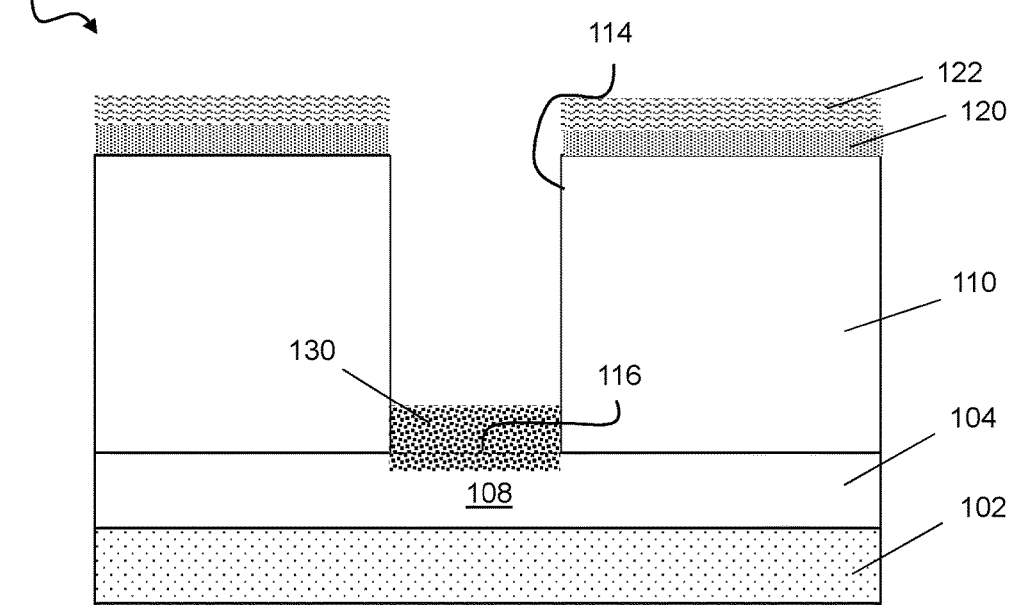

As shown in FIGS. 6-7, refractory metal layer 120 and titanium containing layer 122 may be implanted or doped with a species 126. FIG. 6 shows implanting species 126 in an embodiment wherein refractory metal layer 120 is formed prior to titanium containing layer 122. FIG. 7 shows implanting species 126 in an embodiment wherein titanium containing layer 122 is formed prior to refractory metal 120. In either embodiment, the implanted species 126 may be provided at a temperature of approximately −100° C. to approximately 500° C., an implant dose of approximately 0.5E15 atoms/cm² to approximately 4E15 atoms/cm², and an energy dose of approximately 10 kilo-electron volts (keV) to approximately 50 keV, or more particularly, 20 keV to approximately 40 keV. Species 126 may be implanted at a Tilt angle of 0°+/−3°. Typically, species 126 may be implanted at a Tilt angle of 0°, or with the ion beam perpendicular to the wafer or substrate 102. However, in other embodiments, the implanting may be done at Tilt angle of 0°+/−3° to help ensure the species is implanted at the bottom corners of the opening 114. For Tilt angles of 0°, no twist angle is needed; however the wafer or substrate 102 may be rotated during the implant around the Tilt axis to improve across wafer implant uniformity. However, where species 126 is implanted at non zero Tilt angles, the wafer may need the proper twist and rotation to ensure the implant line of sight is not shadowed or obstructed by any masking layers or device structures. Species 126 may include, for example, at least one of: silicon, germanium, arsenic, phosphorous, antimony, selenium, boron, xenon, indium, aluminum, gallium, and combination thereof. Species 126 may be provided such that species 126 bombards the top film of either refractory metal layer 120 or titanium containing layer 122 and drives the top film into the bottom film of either refractory metal layer 120 or titanium containing layer 122, and into fin 104. The implanting may be controlled by altering the temperature, energy dose, and angle at which species 126 is provided. Species 126 may be implanted such that a mixture 130 is formed from refractory metal layer 120, titanium containing layer 122, and the material of fin 104 as shown in FIG. 8. In some embodiments, it may be desirable to implant silicon and/or germanium to enhance the reaction which causes a silicide to be formed as will be described herein. In other embodiments, it may be desirable to use the implanting process to provide n-type or p-type dopants as part of mixture 130 in addition to or in the alternative to silicon and/or germanium. Mixture 130 may be disposed at bottom surface 116 of opening 114, at an interface of opening 114 and source/drain terminal 108 of fin 104. While implanting of species 126 may occur at portions of refractory metal layer 120 and titanium containing layer 122 outside of opening 114 over dielectric layer 110, mixture 130 may not be formed at those locations as there may not be underlying silicon as there is over fin 104. While FIG. 8 shows an embodiment where refractory metal layer 120 was formed prior to the forming of titanium containing layer 122 (FIGS. 4 and 6), it is to be understood that mixture 130 may also form at bottom surface 116 of opening 114 in an embodiment where titanium containing layer 122 is formed prior to refractory metal layer 120 (FIGS. 5 and 7).

Figure 9:
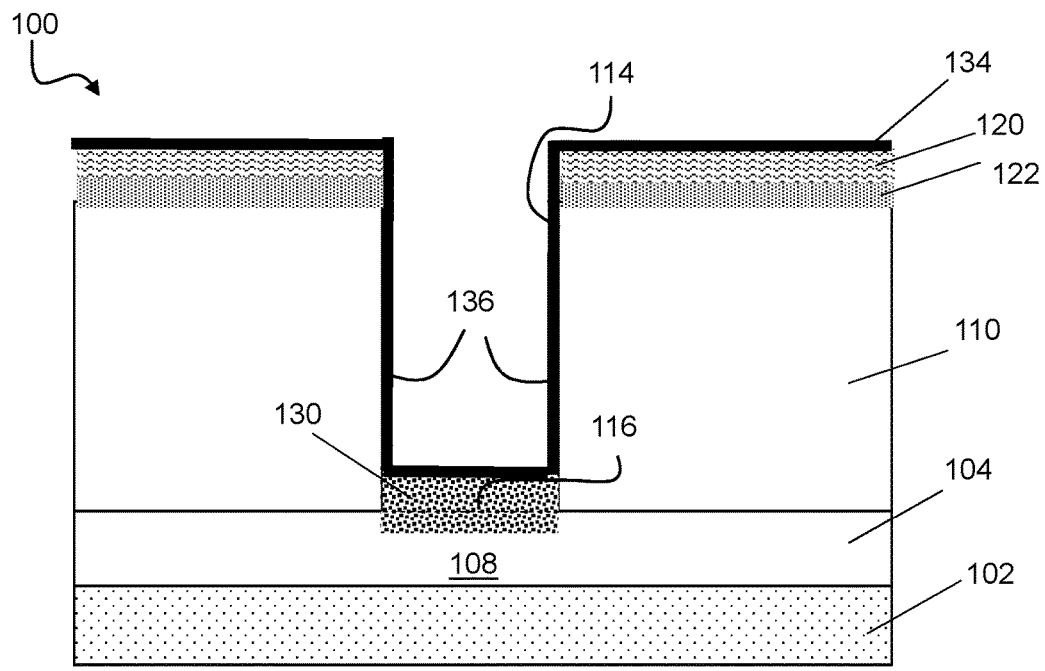

Referring now to FIG. 9, a barrier layer 134 may be formed, e.g., deposited, within opening 114 such that barrier layer 134 is formed over mixture 130 at the bottom of the opening and along the side walls 136 opening 114. That is, barrier layer 134 may be formed such that it substantially lines opening 114. As used herein, "substantially" refers to largely, for the most part, entirely specified or any slight deviation which provides the same technical benefits of the disclosure. Additionally, barrier layer 134 may be formed over mixture 130 over dielectric layer 110. Barrier layer 134 may provide adhesion for a subsequently formed metal fill. Barrier layer 134 may include, for example, at least one of: titanium nitride, tantalum nitride, and other materials having similar properties and/or capable of performing a similar function. Barrier layer 134 may have a thickness of approximately 1.0 nm to approximately 10 nm. In some embodiments, a cleaning process can be performed prior to the formation of barrier layer 134. The cleaning process may include chemical or physical process cleaning such as a plasma clean and/or argon or hydrogen sputtering as known in the art.

Figure 10:
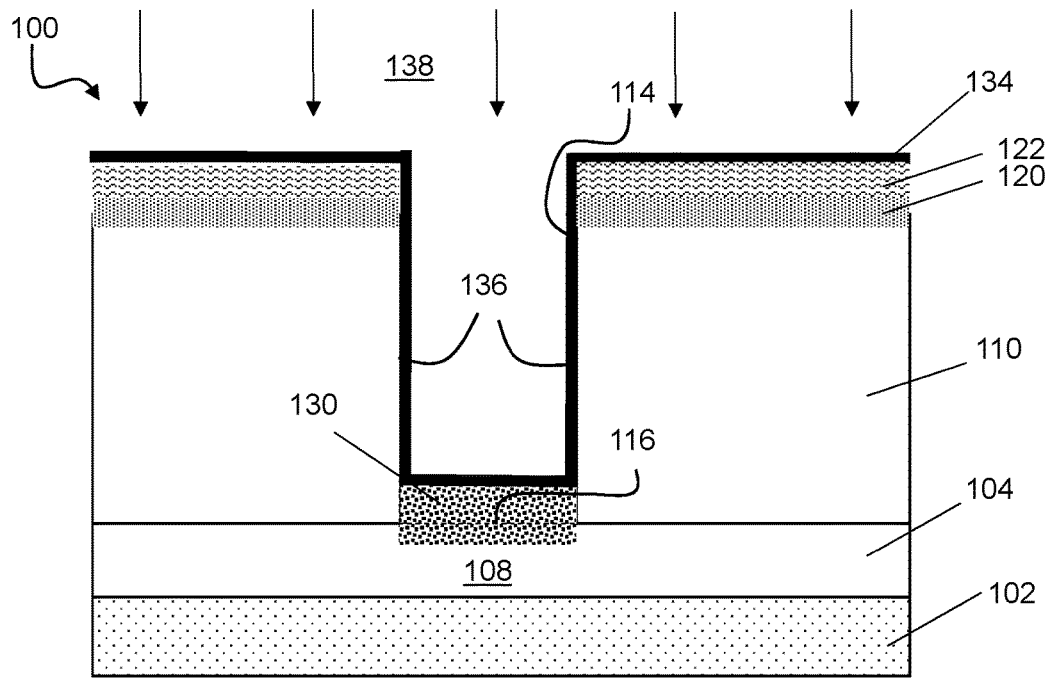
Figure 11:
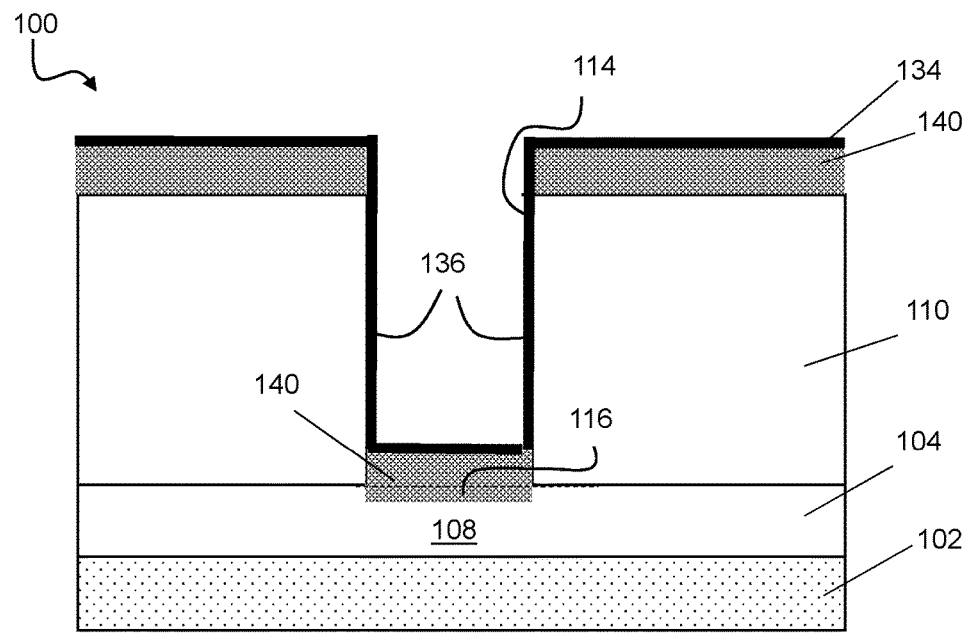

As shown in FIG. 10, an anneal 138 may be performed on mixture 130 of refractory metal 120 and titanium containing layer 122 (and fin 104). Anneal 138 may include, for example, at least one of: a soak anneal, a microwave anneal, a flash anneal, or a laser anneal. In one example, soak annealing may be performed at about 650° C. to 1200° C. for about 0.5 seconds to about 24 hours. In another example, microwave annealing can be performed at about 650° C. to 1200° C. for about 10 milliseconds to 300 seconds. In another specific example, laser annealing may be performed at about 650° C. to 1400° C. for about 100 nanoseconds to 100 milliseconds. Anneal 138 may be performed such that mixture 130 of refractory metal 120, titanium containing layer 122, and fin 104 form a silicide 140 at the bottom of opening 114 as shown in FIG. 11. Additionally, anneal 138 may also cause refractory metal layer 120 and titanium containing layer 122 to combine outside of opening 114 over dielectric layer 110. Barrier layer 134 may be unaffected by anneal 138.

Figure 12:
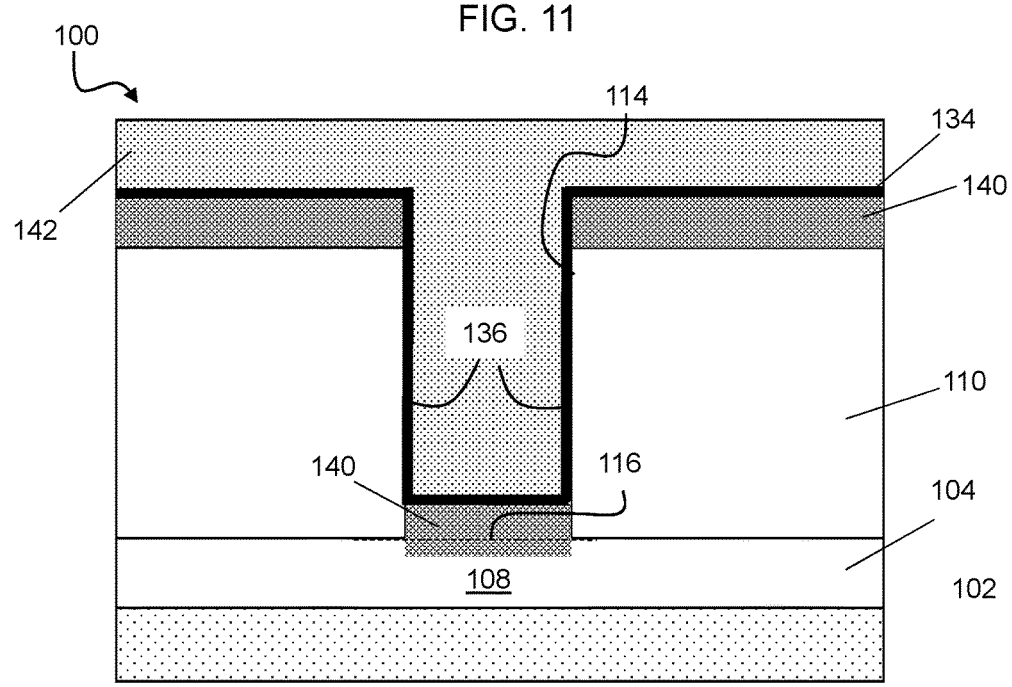
Figure 13:
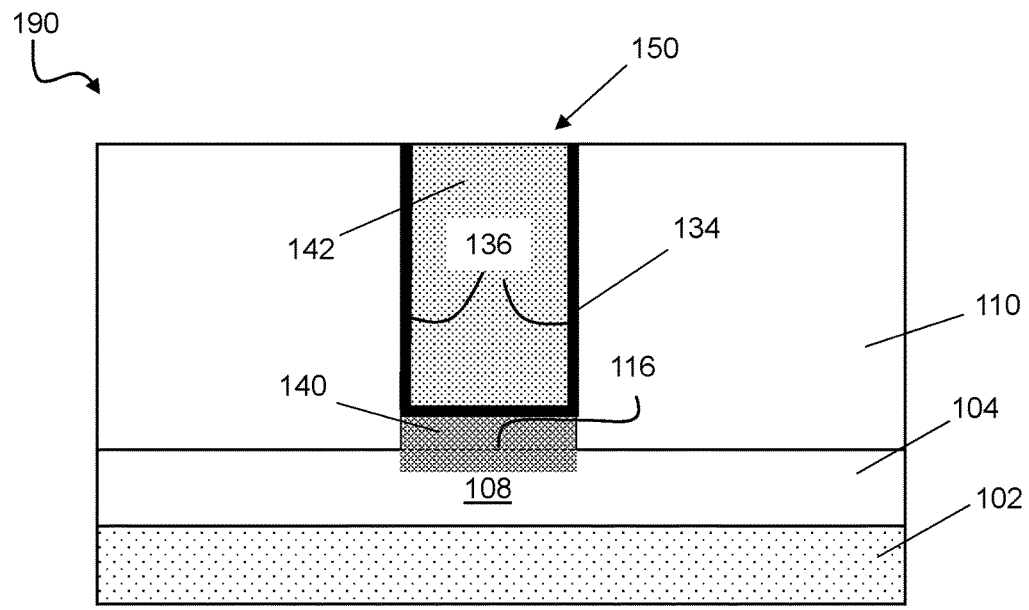

Referring now to FIG. 12, a metal 142 may be formed, e.g., deposited, electroplated, etc., over barrier layer 134 and silicide 140 at the bottom of opening 114 and over dielectric layer 110. Metal 142 may be formed such that it substantially fills opening 114. Metal 142 may include, for example, at least one of: tungsten, cobalt, or copper. Metal 142 may have a thickness of approximately 10 nm to approximately 500 nm. After metal 142 is formed, integrated circuit structure 100 may be planarized to a top surface of dielectric layer 110 as shown in FIG. 13. That is, metal 142, barrier layer 134, and silicide 140 that are outside of opening 114 (FIG. 12) may be removed.

Still referring to FIG. 13, the resulting integrated circuit structure 190 after planarization may include a contact 150 within dielectric layer 110 to source/drain terminal 108 of fin 104. In this embodiment, contact 150 may include a silicide 140 at a top surface of source/drain terminal 108. Overlying silicide 140 may be a barrier layer 134. Barrier layer 134 may also define sidewalls of contact 150 within dielectric layer 110. Barrier layer 134 may extend from atop surface of silicide 140 to a top surface of dielectric layer 110. Contact 150 may also include metal 142 within barrier layer 134 within dielectric layer 110 and over silicide 140. In some embodiments, silicide 140 may include a titanium-tantalum-silicide and may include an implanted species of at least one of: silicon, germanium, arsenic, phosphorous, antimony, selenium, boron, xenon, indium, aluminum, gallium, and combinations thereof.

It is to be understood that in some embodiments, anneal 138 may be performed after metal 142 is formed and/or after planarization in addition to or in the alternative to anneal 138 being performed after barrier layer 134 is formed and prior to metal 142 being formed. Additionally, it is to be understood that while FIGS. 2-13 have been described relative to a cross-section of only a portion of integrated circuit structure 100, aspects of the disclosure are equally applicable to a contact being formed to source/drain terminal 108 of fin 104 on the opposing side of gate structure 106 (FIG. 1). That is, a contact to source/drain terminal 108 on the opposing side of gate structure 106 may be formed at the same time as contact 150 or prior to or after contact 150 is formed.

Aspects of the disclosure as discussed herein results in contact 150 having reduced resistance when used for both an n-type FET (NFET) and a p-type FET (PFET). Further, providing refractory metal layer 120 (FIG. 4) enhances and increases silicide formation because it reacts with fin 104 and provides crystallographic template for titanium containing layer 122 (FIG. 4) for silicide formation. Additionally, the anneal process 138 may be performed at a temperature lower than conventionally performed resulting in no damage to gate structure 106 (FIG. 1).

In another embodiment, it may be desirable to control the implanting of species between adjacent PFETs and NFETs in addition to reducing resistance of the contacts to source/drain terminals of the adjacent PFETs and NFETs. Referring now to FIG. 14, a top-down view of an integrated circuit structure 200 is shown. Integrated circuit 200 structure is shown as a FINFET having a FET 202 and a FET 204 adjacent to one another on a substrate 206. FET 202 may include a fin 210 overlying substrate 202 and FET 204 may include a fin 212 overlying substrate 202 adjacent to and separated from fin 210. A gate structure 216 may be disposed perpendicular to and over fins 210, 212. However, it is to be understood that while aspects of the present disclosure are described with respect to FINFETs, the disclosure is equally applicable to other types of transistors, e.g., planar transistors.

Substrate 206 may include any of the materials discussed for substrate 102 (FIG. 1) from which fins 210, 212 may be formed. That is, substrate 206 may include a bulk substrate (shown) or a SOI substrate having a semiconducting layer from which fins 210, 212 may be patterned overlying an insulating layer overlying another semiconducting layer. Further, gate structure 216 may be formed perpendicular to fins 210, 212 and over substrate 206. Gate structure 216 may include a gate dielectric, gate conductor, gate cap layer, and spacers as are known the art, but not shown herein for brevity. Fin 210 may be doped and or an epitaxial layer can be grown on it as known in the art to create source/drain terminals 218 on opposing sides of gate structure 216. Fin 212 may be doped and or an epitaxial layer can be grown on it as known in the art to create source/drain terminals 220 on opposing sides of gate structure 216.

Figure 15:
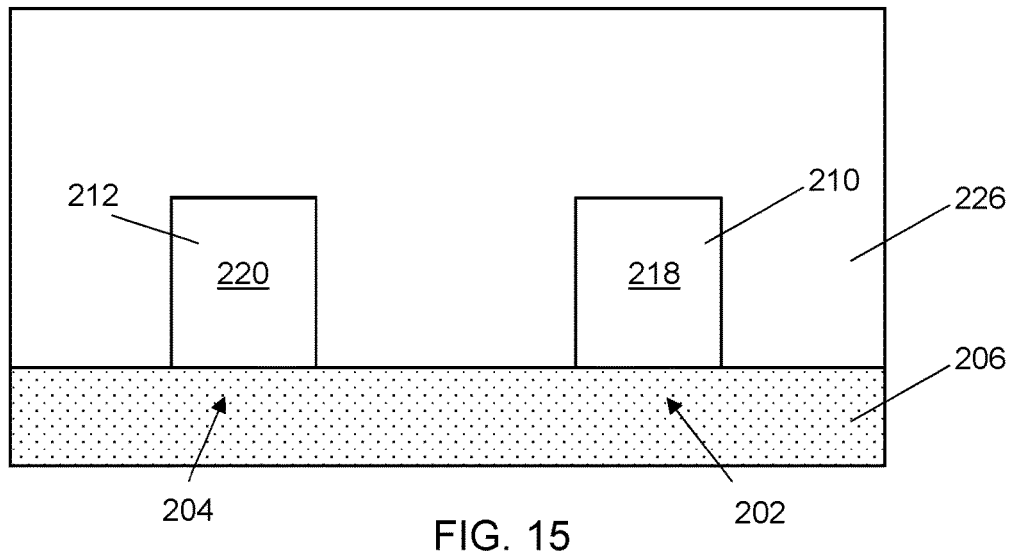

FIG. 15 shows a cross-section taken along line B-B of FIG. 14 but with a dielectric layer 226 formed over fins 210, 212. While not shown in FIGS. 14-15, there may also be a shallow trench isolation (STI) region between fin 210 and fin 212. As known in the art, STI regions prevent current leakage between adjacent FETs. Dielectric layer 226 may be formed via deposition such that dielectric layer 226 covers fins 210, 212 and substrate 206. Dielectric layer 226 may be planarized to a top surface of gate structure 216 (FIG. 14). Dielectric layer 226 can be composed of any of the materials discussed relative to dielectric layer 110 (FIG. 2).

Figure 16:
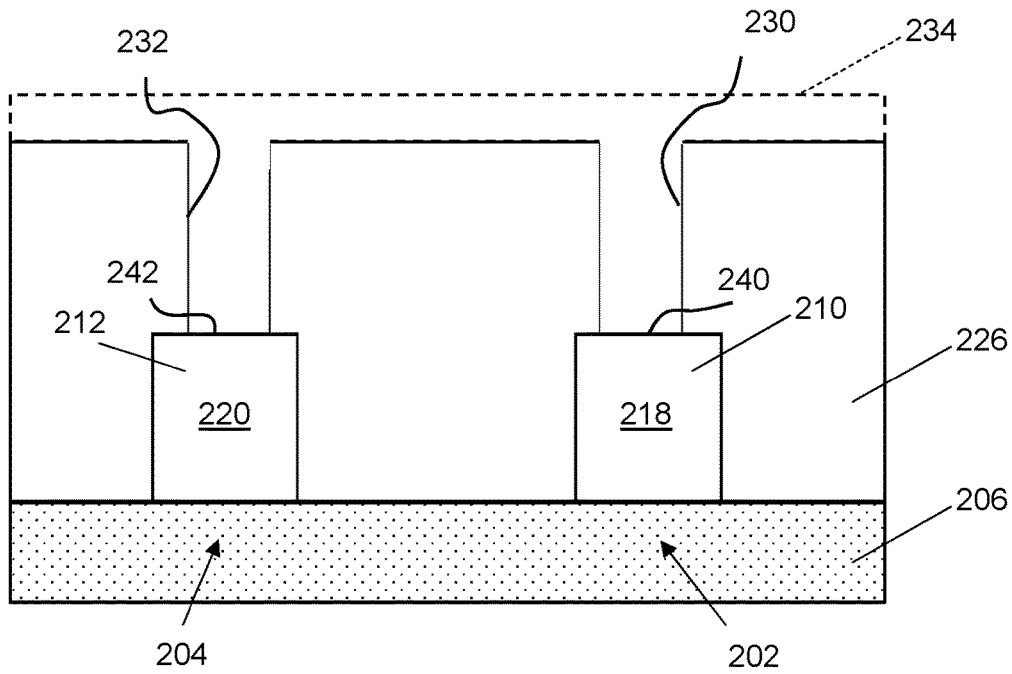

Openings 230, 232 may be formed within dielectric layer 226 to expose source/drain terminals 218, 220 of fins 210, 212 as shown in FIG. 16. That is, opening 230 may be formed within dielectric layer 226 to expose source/drain terminal 218 of fin 210 of FET 202, and opening 232 may be formed within dielectric layer 226 to expose source/drain terminal of fin 212 of FET 204. A mask 234 (shown in phantom) may be formed over dielectric layer 226 and patterned and etched to expose a top surface of dielectric layer 226 where openings 230, 232 are to be formed. Subsequently, dielectric layer 226 may be etched to form openings 230, 232 to expose source/drain terminals 218, 220 of fins 210, 212 and mask 234 may be removed. Openings 230, 232 may facilitate formation of a contact to source/drain terminals 218, 220 at bottom surfaces 240, 242 of openings 230, 232 as will be described herein.

Figure 17:
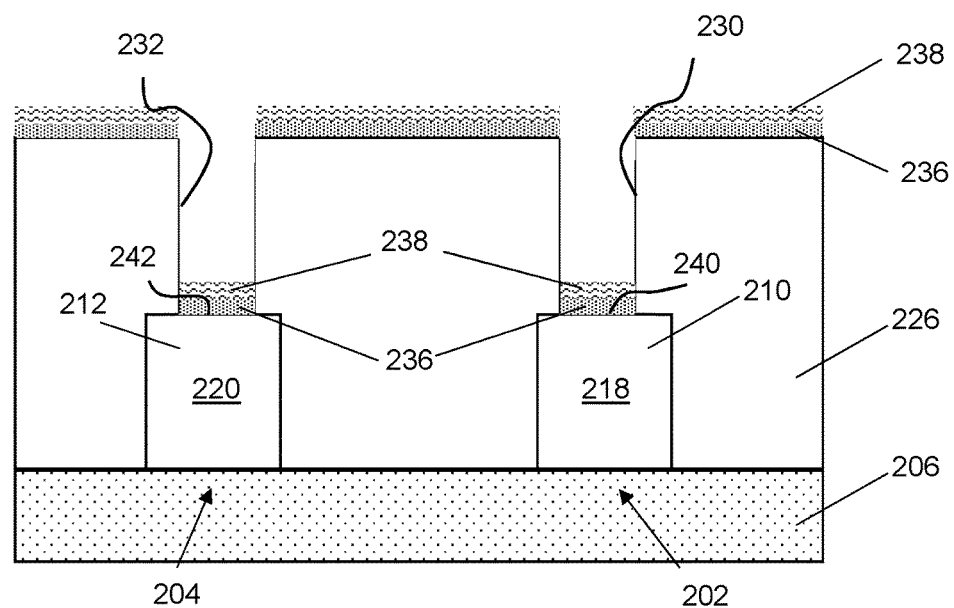

As shown in FIG. 17, a refractory metal layer 236 and a titanium containing layer 238 may be formed, e.g., via PVD, at bottom surfaces 240, 242 of openings 230, 232 and a top surface of dielectric layer 226. That is, refractory metal layer 236 and titanium containing layer 238 may be deposited such that refractory metal layer 236 and titanium containing layer 238 only line horizontal surfaces, e.g., a top surface of fins 210, 212 exposed by openings 230, 232 and a top surface of dielectric layer 226 outside of openings 230, 232. Vertical surfaces, or the side walls, of openings 230, 232 are not lined with refractory metal layer 236 and titanium containing layer 238. In some embodiments, refractory metal layer 236 may be formed prior to the formation of titanium containing layer 238 as shown in FIG. 17. In such an embodiment, refractory metal layer 236 may be formed such that refractory metal layer 236 is in contact with the bottom surface 240, 242 of openings 230, 232 or a top surface of the exposed fins 210, 212, e.g., source/drain terminals 218, 220, within openings 230, 232. However, in other embodiments, titanium containing layer 238 may be formed prior to the formation of refractory metal layer 236 as was discussed relative to FIG. 5. In such an embodiment, titanium containing layer 238 may be formed such that titanium containing layer 238 is in contact with bottom surface 240, 242 of openings 230, 232 or a top surface of the exposed fins 210, 212, e.g., source/drain terminals 218, 220, within openings 230, 232. In other embodiments, the forming of refractory metal layer 236 and titanium containing layer 238 includes at least one of: co-sputtering or co-deposition of refractory metal layer 236 and titanium containing layer 238. In another embodiment, an alloy of refractory metal layer 236 and titanium containing layer 238 may be formed on bottom surfaces 240, 242 of openings 230, 232. Refractory metal layer 236 and titanium containing layer 238 may include any of the materials discussed relative to refractory metal layer 120 (FIG. 4) and titanium containing layer 122 (FIG. 4). Refractory metal layer 236 and titanium containing layer 238 may each be formed to have a thickness of approximately 1 nm to approximately 25 nm.

Figure 18:
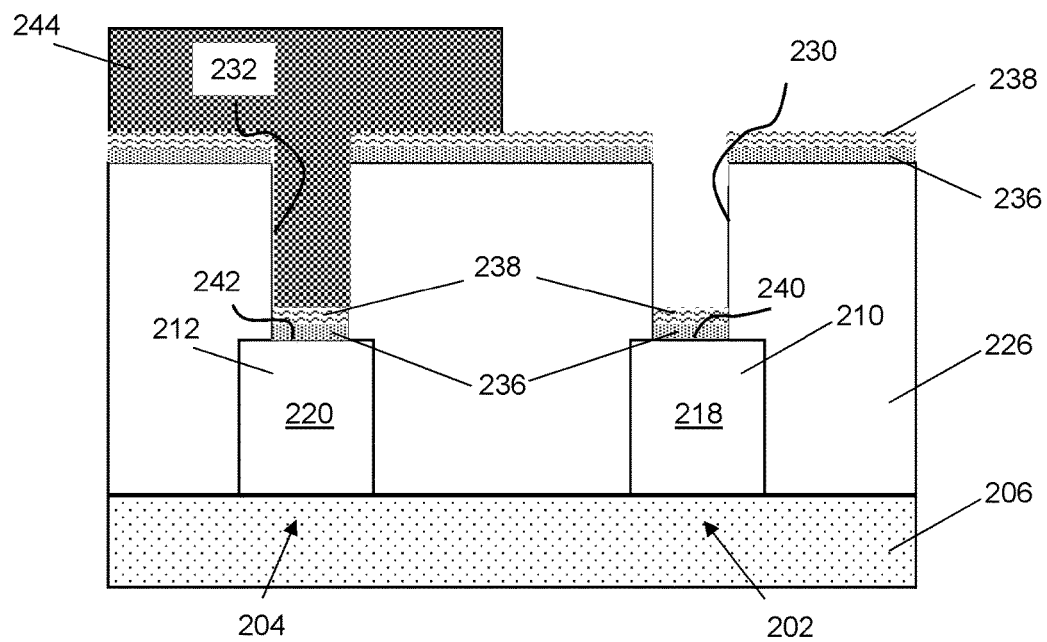

As shown in FIG. 18, a mask 244 may be formed over refractory metal layer 236 and/or titanium containing layer 238. Mask 244 may be etched such that opening 230 over fin 210 of FET 202, and refractory metal layer 236 and titanium containing layer 238 therein, are exposed. In some embodiments (shown), portions of refractory metal 236 and titanium containing layer 238 over dielectric layer 226 adjacent to opening 230 may also be exposed by etching of mask 244. Mask 244 may remain over opening 232, and refractory metal layer 236 and titanium containing layer 238 therein. In some embodiments (shown), mask 244 may remain over portions of refractory metal 236 and titanium containing layer 238 over dielectric layer 226 adjacent to opening 232.

Figure 19:
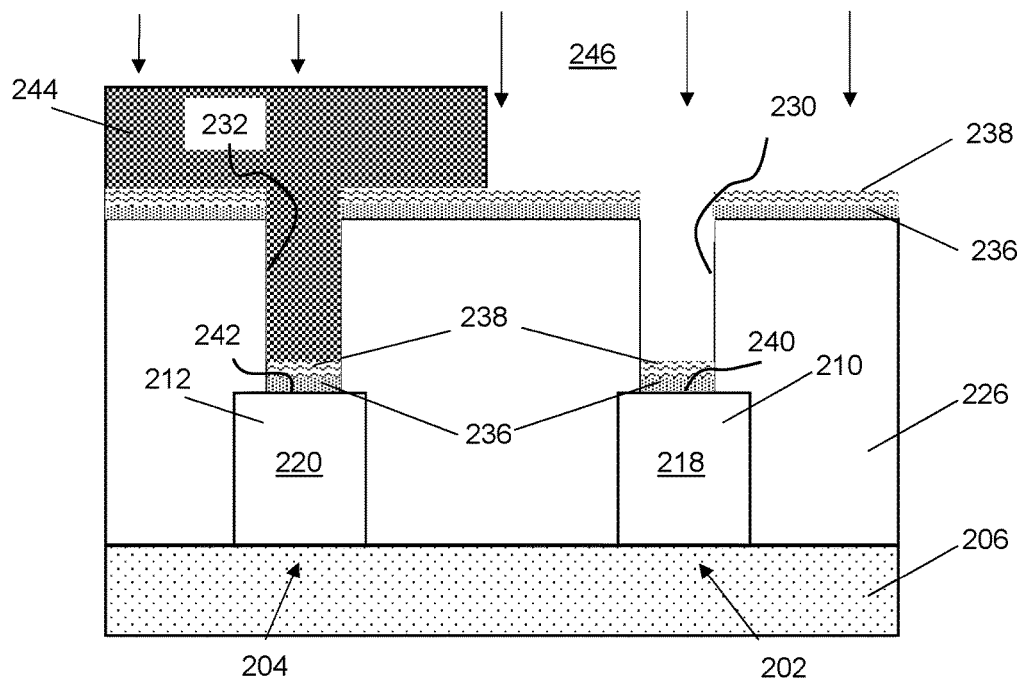
Figure 20:
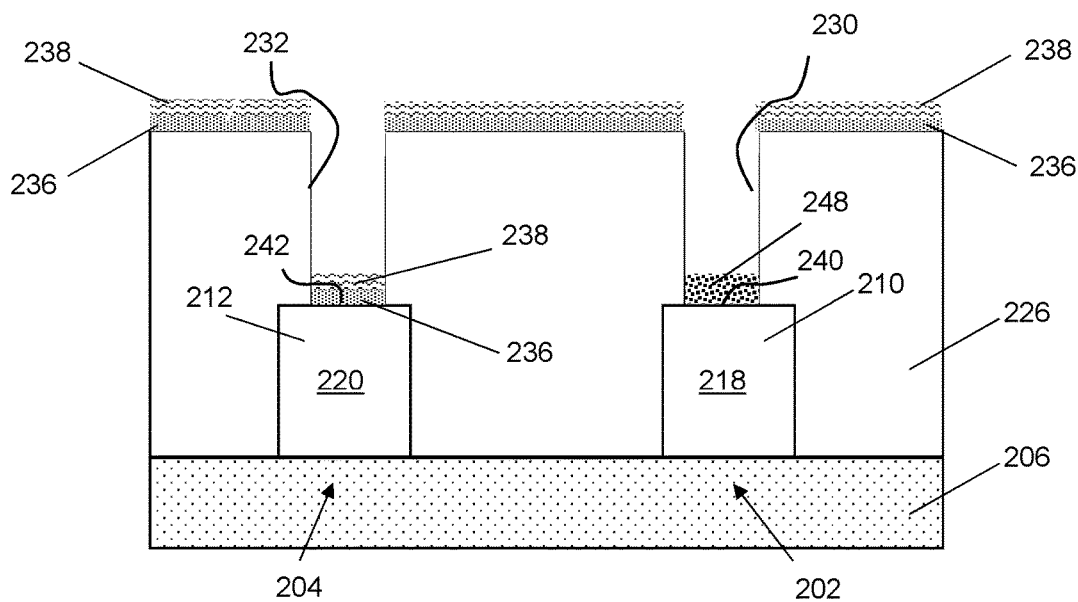

Referring now to FIG. 19, species 246 may be implanted into exposed portions of refractory metal layer 236 and titanium containing layer 238. As shown, species 246 may be implanted into refractory metal layer 236 and titanium containing layer 238 at the bottom surface of opening 230. That is, species 246 may be implanted into refractory metal layer 236 and titanium containing layer 238 over source/drain terminal 218 of fin 210. Additionally, since portions of refractory metal layer 236 and titanium containing layer 238 over dielectric 226 adjacent to opening 230 are also exposed, those portions may also be implanted with species 242. The implanted species 246 may be provided at a temperature of approximately −100° C. to approximately 500° C., an implant dose of approximately 0.5E15 atoms/cm$^2$ to approximately 4E15 atoms/cm$^2$, and an energy dose of approximately 10 kilo-electron volts (keV) to approximately 50 keV, or more particularly, 20 keV to approximately 40 keV. Species 246 may be implanted at a Tilt angle of 0°+/−3°. Typically, species 246 may be implanted at a Tilt angle of 0°, or with the ion beam perpendicular to the wafer or substrate 206. However, in other embodiments, the implanting may be done at Tilt angle of 0°+/−3° to help ensure the species is implanted at the bottom corners of the opening 230. For Tilt angles of 0°, no twist angle is needed; however the wafer or substrate 206 may be rotated during the implant around the Tilt axis to improve across wafer implant uniformity. However, where species 246 is implanted at non zero Tilt angles, the wafer may need the proper twist and rotation to ensure the implant line of sight is not shadowed or obstructed by any masking layers or device structures. Species 246 may include, for example, at least one of: silicon, germanium, arsenic, phosphorous, antimony, selenium, boron, xenon, indium, aluminum, gallium, and combinations thereof. Species 246 may be provided such that species 246 bombards the top film of either refractory metal layer 236 or titanium containing layer 238 and drives the top film into the bottom film of either refractory metal layer 236 or titanium containing layer 238, and into fin 210 of FET 202. The implanting may be controlled by altering the temperature, energy dose, and angle at which species 246 is provided. Species 242 may be implanted such that a mixture 248 is formed from refractory metal layer 236, titanium containing layer 238, and the material of fin 210 as shown in FIG. 20. In some embodiments, it may be desirable to implant silicon and/or germanium to enhance the reaction which causes a silicide to be formed as will be described herein. In other embodiments, it may be desirable to use the implanting process to provide n-type or p-type dopants as part of mixture 248 in addition to or in the alternative to silicon and/or germanium. Mixture 248 may be disposed at bottom surface 240 of opening 230, at an interface of opening 230 and source/drain terminal 218 of fin 210. While implanting of species 242 may occur at portions of refractory metal layer 236 and titanium containing layer 238 outside of opening 230 over dielectric layer 226, mixture 248 may not be formed at those locations as there may not be underlying silicon as there is over fin 210.

In one embodiment, FET 202 may be a PFET. In such an embodiment, species 246 may include, for example, at least one of: silicon, germanium, indium, gallium, and combinations thereof. In another embodiment, FET 202 may be an NFET. In such an embodiment, species 246 may include, for example, at least one of: silicon, germanium, arsenic, xenon, and combinations thereof.

Figure 21:
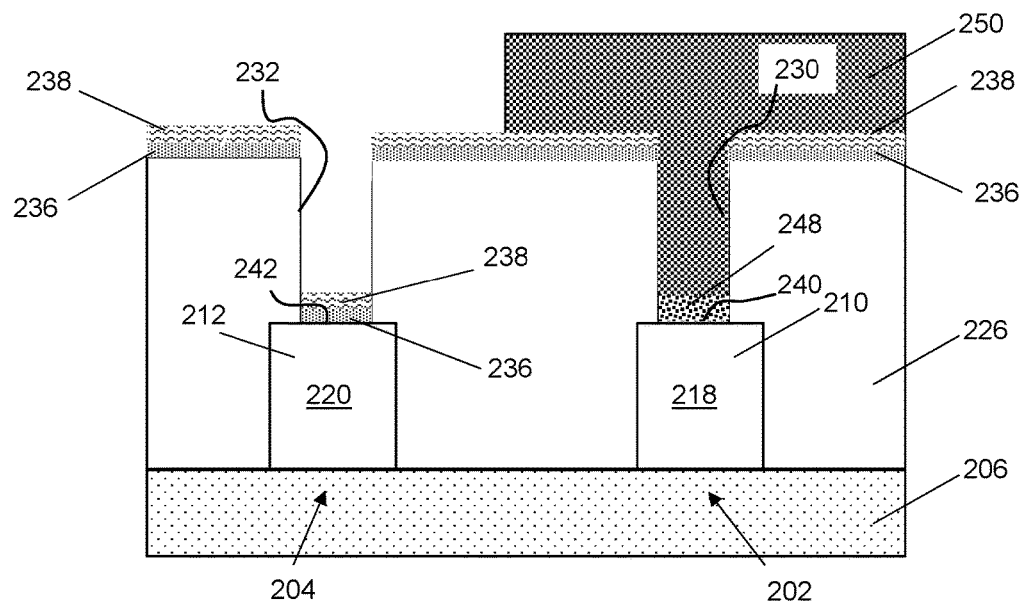

Referring now to FIG. 21, another mask 250 may be formed over refractory metal layer 236 and/or titanium containing layer 238 and over mixture 248. Mask 250 may be etched such that opening 232 over fin 220 of FET 204, and refractory metal layer 236 and titanium containing layer 238 therein, are exposed. In some embodiments (shown), portions of refractory metal 236 and titanium containing layer 238 over dielectric layer 226 adjacent to opening 232 may also be exposed by etching of mask 250. Mask 250 may remain over opening 230, and mixture 244 therein. In some embodiments (shown), mask 250 may remain over portions of mixture 242 over dielectric layer 226 adjacent to opening 230.

Figure 22:
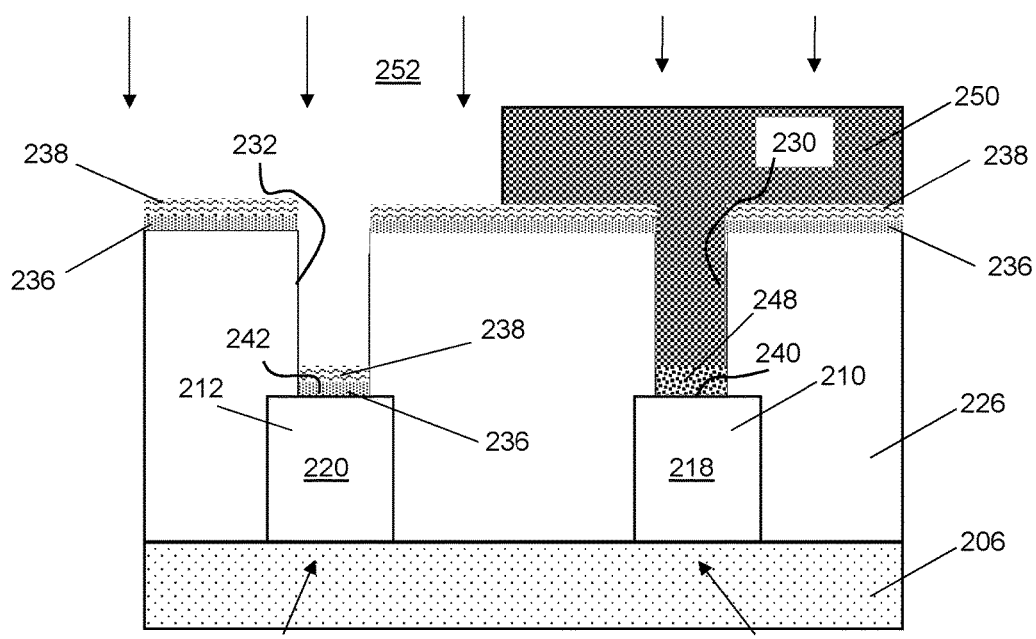
Figure 23:
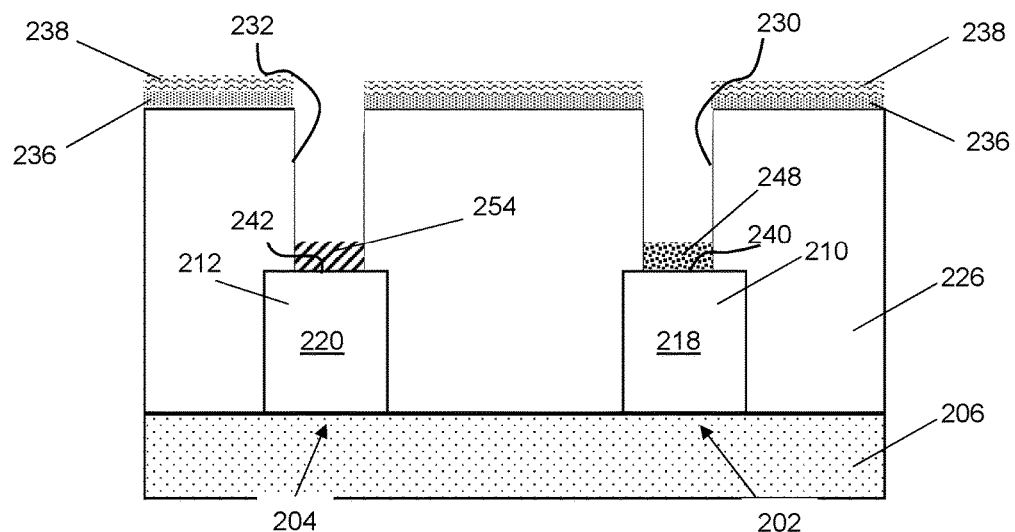

Referring now to FIG. 22, species 252 may be implanted into exposed portions of refractory metal layer 236 and titanium containing layer 238. As shown, species 252 may be implanted into refractory metal layer 236 and titanium containing layer 238 at the bottom surface of opening 232. That is, species 252 may be implanted into refractory metal layer 236 and titanium containing layer 238 over source/drain terminal 220 of fin 212. Additionally, since portions of refractory metal layer 236 and titanium containing layer 238 over dielectric 226 adjacent to opening 232 are also exposed, those portions may also be implanted with species 250. The implanted species 252 may be provided at a temperature of approximately −100° C. to approximately 500° C., an implant dose of approximately 0.5E15 atoms/cm$^2$ to approximately 4E15 atoms/cm$^2$, and an energy dose of approximately 10 kilo-electron volts (keV) to approximately 50 keV, or more particularly, 20 keV to approximately 40 keV. Species 252 may be implanted at a Tilt angle of 0°+/−3°. Typically, species 252 may be implanted at a Tilt angle of 0°, or with the ion beam perpendicular to the wafer or substrate 206. However, in other embodiments, the implanting may be done at Tilt angle of 0°+/−3° to help ensure the species is implanted at the bottom corners of the opening 232. For Tilt angles of 0°, no twist angle is needed; however the wafer or substrate 206 may be rotated during the implant around the Tilt axis to improve across wafer implant uniformity. However, where species 252 is implanted at non zero Tilt angles, the wafer may need the proper twist and rotation to ensure the implant line of sight is not shadowed or obstructed by any masking layers or device structures. Species 252 may include, for example, at least one of: silicon, germanium, arsenic, phosphorous, antimony, selenium, boron, xenon, indium, aluminum, gallium, and combinations thereof. Species 252 may be provided such that species 250 bombards the top film of either refractory metal layer 236 or titanium containing layer 238 and drives the top film into the bottom film of either refractory metal layer 236 or titanium containing layer 238, and into fin 212. The implanting may be controlled by altering the temperature, energy dose, and angle at which species 252 is provided. Species 252 may be implanted such that a mixture 254 is formed from refractory metal layer 236, titanium containing layer 238, and the material of fin 212 as shown in FIG. 21. In some embodiments, it may be desirable to implant silicon and/or germanium to enhance the reaction which causes a silicide to be formed as will be described herein. In other embodiments, it may be desirable to use the implanting process to provide n-type or p-type dopants as part of mixture 254 in addition to or in the alternative to silicon and/or germanium. Mixture 254 may be disposed at the bottom of opening 232, at an interface of opening 232 and source/drain terminal 220 of fin 212. While implanting of species 252 may occur at portions of refractory metal layer 236 and titanium containing layer 238 outside of opening 232 over dielectric layer 226, mixture 254 may not be formed at those locations as there may not be underlying silicon as there is over fin 212.

In one embodiment, where, FET 202 is an NFET, FET 204 may be a PFET. In such an embodiment, species 252 may include, for example, at least one of: silicon, germanium, indium, gallium, and combinations thereof. In another embodiment, where FET 202 is a PFET, FET 204 may be an NFET. In such an embodiment, species 252 may include, for example, at least one of: silicon, germanium, arsenic, xenon, and combinations thereof.

Figure 24:
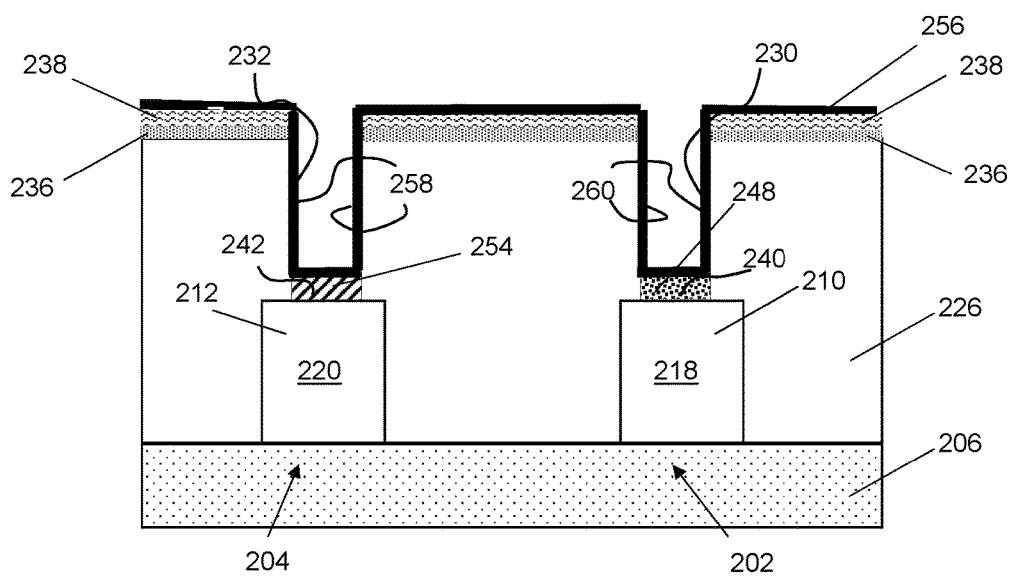

Referring now to FIG. 24, a barrier layer 256 may be formed, e.g., deposited, within openings 230, 232 such that barrier layer 256 is formed over mixtures 244, 252 at the bottom of the openings 230, 232 and along the side walls 258, 260 of openings 230, 232. Additionally, barrier layer 256 may be formed over mixtures 248, 254 over dielectric layer 226. Barrier layer 256 may provide better adhesion for a subsequently formed metal. Barrier layer 256 may include any of the materials discussed relative to barrier layer 134 (FIG. 7). Barrier layer 134 may have a thickness of approximately 1.0 nm to approximately 10 nm. In some embodiments, a cleaning process can be performed prior to the formation of barrier layer 256. The cleaning process may include chemical or physical process cleaning such as a plasma clean and/or argon or hydrogen sputtering as known in the art.

Figure 25:
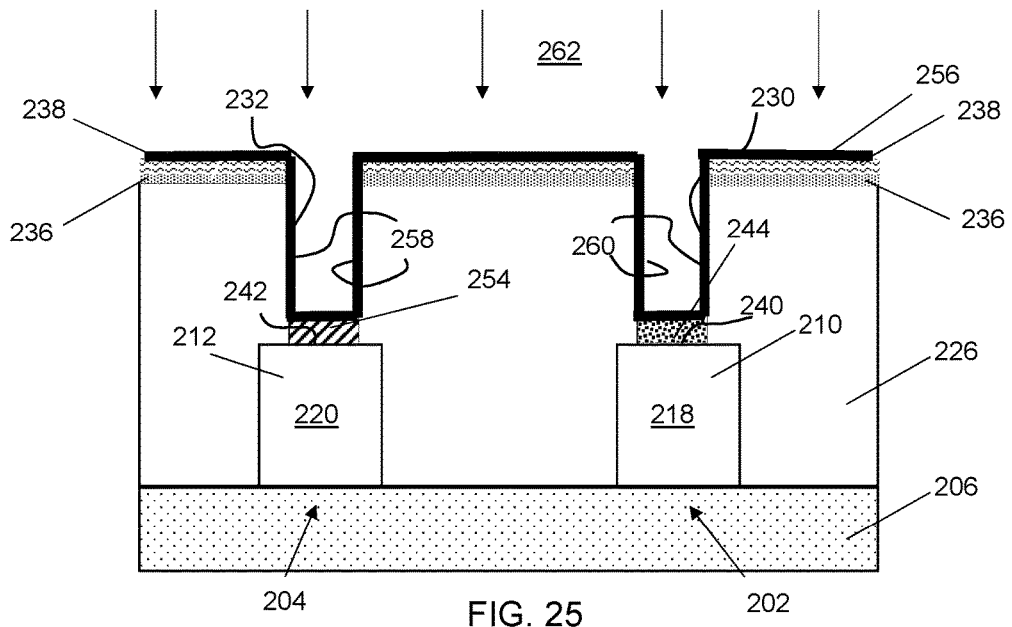
Figure 26:
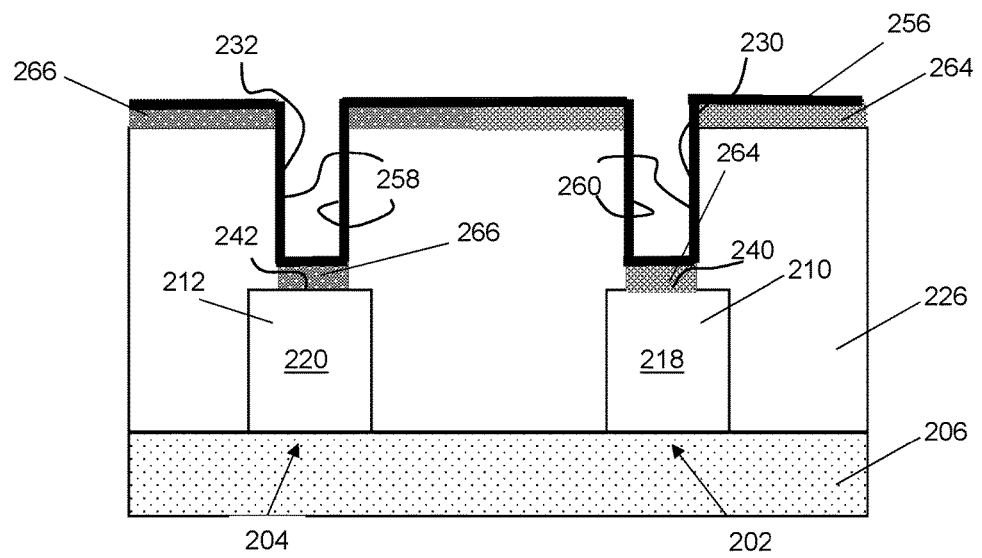

As shown in FIG. 25, an anneal 262 may be performed on mixtures 248, 252 of refractory metal 236 and titanium containing layer 238 (and material of fins 210, 212 and/or dielectric layer 226). Anneal 262 may include, for example, at least one of: a soak anneal, a microwave anneal, a flash anneal, or a laser anneal. In one example, soak annealing may be performed at about 650° C. to 1200° C. for about 0.5 seconds to about 24 hours. In another example, microwave annealing can be performed at about 650° C. to 1200° C. for about 10 milliseconds to 300 seconds. In another specific example, laser annealing may be performed at about 650° C. to 1400° C. for about 100 nanoseconds to 100 milliseconds. Anneal 262 may be performed such that mixtures 244, 252 of refractory metal 236, titanium containing layer 238, and fins 210, 212 form silicides 264, 266 at bottom surfaces 240, 242 of openings 230, 232 as shown in FIG. 26. Additionally, anneal 262 may also cause refractory metal layer 236 and titanium containing layer 238 to combine outside of openings 230, 236 over dielectric layer 226. Barrier layer 256 may be unaffected by anneal 262.

Figure 27:
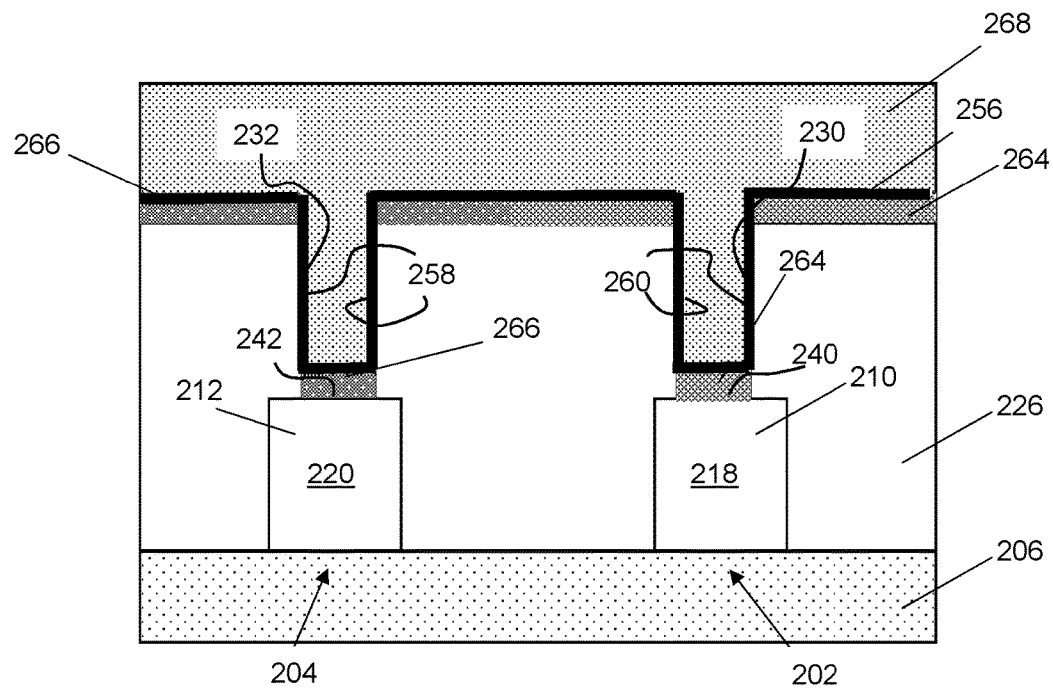

Referring now to FIG. 27, a metal 268 may be formed over barrier layer 256 and silicides 264, 266 at the bottom of openings 230, 232 and over dielectric layer 236. Metal 268 may be formed such that it substantially fills openings 230, 232. Metal 268 may include any of the materials described with respect to metal 142 (FIG. 12). Metal 268 may have a thickness of approximately 10 nm to approximately 500 nm. After metal 268 is formed, integrated circuit structure may be planarized to a top surface of dielectric layer 226 as shown in FIG. 28. That is, metal 268, barrier layer 256, and silicides 264, 266 that are outside of openings 230, 232 (FIG. 27) may be removed.

Still referring to FIG. 28, the resulting integrated circuit structure 290 after planarization may include a contact 270 within dielectric layer 226 to source/drain terminal 218 of fin 210 of FET 202. Additionally, integrated circuit structure 290 may include a contact 272 within dielectric layer 226 to source/drain terminal 220 of fin 212 of FET 204. In this embodiment, contact 270 may include silicide 264 at a top surface of source/drain terminal 218. Overlying silicide 264 may be barrier layer 256. Barrier layer 256 may also define side walls 260 of contact 270 within dielectric layer 226. Barrier layer 256 may extend along a vertical length of contact 270 from a top surface of silicide 264 to a top surface of dielectric layer 226. Contact 270 may also include metal 268 within barrier layer 256 within dielectric layer 226 and over silicide 264. In some embodiments, silicide 264 may be include titanium-tantalum-silicide and may include an implanted species of at least one of: silicon, germanium, arsenic, phosphorous, antimony, selenium, boron, xenon, indium, aluminum, gallium, and combinations thereof.

Contact 272 may include silicide 266 at a top surface of source/drain terminal 220 of FET 204. Overlying silicide 266 may be barrier layer 256. Barrier layer 256 may also define side walls 258 of contact 272 within dielectric layer 226. Barrier layer 256 may extend along a vertical length contact 272 from a top surface of silicide 266 to a top surface of dielectric layer 226. Contact 272 may also include metal 268 within barrier layer 256 within dielectric layer 226 and over silicide 266. In some embodiments, silicide 266 may be a titanium-tantalum-silicide and may include an implanted species of at least one of: silicon, germanium, arsenic, phosphorous, antimony, selenium, boron, xenon, indium, aluminum, gallium, and combinations thereof.

It is to be understood that in some embodiments, annealing may be performed after metal 266 is formed and/or after planarization in addition to or in the alternative to anneal 258 being performed after barrier layer 256 is formed and prior to metal 268 being formed. Additionally, it is to be understood that while FIGS. 13-26 have been described relative to a cross-section of only a portion of integrated circuit structure 200, aspects of the disclosure are equally applicable to a contact being formed to source/drain terminals 218, 220 of fin 210, 212 on the opposing side of gate structure 216 (FIG. 12). That is, a contact to source/drain terminals 218, 220 on the opposing side of gate structure 216 may be formed at the same time as contacts 270, 272 or prior to or after contacts 270, 272 are formed.

Aspects of the disclosure as discussed herein results in contacts 270, 272 having reduced resistance when used for NFETs and PFETs. Further, providing refractory metal layer 236 (FIG. 15) enhances and increases silicide formation because it reacts better with fins 210, 212 or underlying semiconductor material than titanium containing layer 238 (FIG. 15) would alone. Additionally, the anneal process 258 may be performed at a temperature lower than conventionally performed resulting in no damage to gate structure 216 (FIG. 12).

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming an integrated circuit structure, the method comprising:
    forming an opening within a dielectric layer to expose a source/drain terminal thereunder;
    forming a refractory metal layer and a titanium containing layer at a bottom surface of the opening;
    implanting a species within the refractory metal layer and the titanium containing layer;
    forming a barrier layer over the implanted refractory metal layer and the titanium containing layer such that the barrier layer substantially lines the opening;
    performing an anneal such that the refractory metal layer and the titanium containing layer combine to form a silicide at the bottom of the opening; and
    forming a metal over the silicide at the bottom of the opening and the barrier layer substantially lining the opening to substantially fill the opening.

2. The method of claim 1, further comprising:
    planarizing, after the forming of the metal, to a top surface of the dielectric layer.

3. The method of claim 1, wherein the forming of the refractory metal layer and the titanium containing layer includes forming the refractory metal layer prior to the titanium containing layer.

4. The method of claim 1, wherein the forming of the refractory metal and the titanium containing layer includes forming the titanium containing layer prior to the refractory metal layer.

5. The method of claim 1, wherein the annealing includes at least one of: a soak anneal, a microwave anneal, a flash anneal, or a laser anneal.

6. The method of claim 1, wherein the implanting includes implanting at least one of: silicon, germanium, arsenic, phosphorous, antimony, selenium, boron, xenon, indium, aluminum, gallium, and combinations thereof.

7. The method of claim 1, wherein the forming of the refractory metal layer and the titanium containing layer includes at least one of: co-deposition or co-sputtering of the refractory metal layer and the titanium containing layer.

8. A method of forming a set of contacts, the method comprising:
    forming a first opening in a dielectric layer to expose a first source/drain terminal of a first field-effect-transistor (FET) and a second opening in the dielectric layer to expose a second source/drain terminal of a second FET;
    forming a refractory metal layer and a titanium containing layer at a bottom surface of each opening;
    forming a first mask over the refractory metal layer and the titanium containing layer at the bottom surface of the second opening;
    implanting a first species within the refractory metal layer and the titanium containing layer at the bottom surface of first opening;
    removing the first mask and forming a second mask over the refractory metal layer and the titanium containing layer at the bottom surface of the second opening;
    implanting a second species within the refractory metal layer and the titanium containing layer at the bottom surface of the second opening;
    removing the second mask;
    forming a barrier layer over the refractory metal layer and the titanium containing layer implanted with the first species within the first opening and over the refractory metal layer and the titanium containing layer implanted with the second species within the second opening such that the barrier layer substantially lines each opening;
    performing an anneal such that the refractory metal layer and the titanium containing layer implanted with the first species combine to form a first silicide at a bottom surface of the first opening and the refractory metal layer and the titanium containing layer implanted with the second species combine to form a second silicide at the bottom surface of the second opening; and
    forming a metal over the first and second silicides at the bottom of each opening and the barrier layer substantially lining each opening to substantially fill each opening.

9. The method of claim 8, wherein the first FET includes an n-type FET (NFET) and the second FET includes a p-type FET (PFET), and
    wherein the first species includes at least one of: silicon, germanium, arsenic, or xenon, and the second species includes at least one of: silicon, germanium, indium, or gallium.

10. The method of claim 8, wherein the first FET includes a p-type FET (PFET) and the second FET includes an n-type FET (NFET), and wherein the first species includes at least one of: silicon, germanium, indium, or gallium, and the second species includes at least one of: silicon, germanium, arsenic, or xenon.

11. The method of claim 8, further comprising:

performing a chemical mechanical polish, after the forming of the metal, such that any material over the dielectric layer is removed.

12. The method of claim 8, wherein the forming of the refractory metal layer and the titanium containing layer includes forming the refractory metal layer prior to the titanium containing layer.

13. The method of claim 8, wherein the forming of the refractory metal layer and the titanium containing layer includes forming the titanium containing layer prior to the refractory metal layer.

14. The method of claim 8, wherein the forming of the refractory metal layer and the titanium containing layer includes at least one of: co-deposition or co-sputtering of the refractory metal layer and the titanium containing layer.

15. The method of claim 8, wherein the annealing includes at least one of: a soak anneal, a microwave anneal, a flash anneal, or a laser anneal.

16. The method of claim 8, wherein the refractory metal layer includes tantalum.

\* \* \* \* \*